(12) United States Patent
Gilton

(10) Patent No.: US 7,727,786 B2
(45) Date of Patent: Jun. 1, 2010

(54) PHOTON-BASED MEMORY DEVICE

(75) Inventor: Terry L. Gilton, Boise, ID (US)

(73) Assignee: Micron Technology, Inc.

( * ) Notice: Subject to any disclaimer, the term of this patent is extended or adjusted under 35 U.S.C. 154(b) by 130 days.

(21) Appl. No.: 12/027,661

(22) Filed: Feb. 7, 2008

(65) Prior Publication Data
US 2008/0131984 A1 Jun. 5, 2008

Related U.S. Application Data

(62) Division of application No. 10/924,225, filed on Aug. 24, 2004, now Pat. No. 7,352,007.

(51) Int. Cl.
*H01L 21/70* (2006.01)
(52) U.S. Cl. .......... 438/24; 257/E21.147; 257/E21.287; 438/29; 438/59; 438/69; 977/814; 977/943; 977/950
(58) Field of Classification Search .......... 257/E21.147, 257/E21.287; 438/24, 29, 57, 59; 977/814, 977/932, 943, 949, 950
See application file for complete search history.

(56) References Cited

U.S. PATENT DOCUMENTS

| 4,449,206 A | | 5/1984 | Tokitsu et al. |
| 4,789,965 A | * | 12/1988 | Michl et al. .................. 365/121 |
| 4,855,950 A | | 8/1989 | Takada |
| 4,864,536 A | | 9/1989 | Lindmayer |
| 4,900,691 A | | 2/1990 | Jun |
| 5,124,944 A | * | 6/1992 | Suzuki et al. ................ 365/113 |
| 5,253,198 A | * | 10/1993 | Birge et al. .................. 365/106 |
| 5,268,862 A | * | 12/1993 | Rentzepis .................... 365/151 |
| 5,321,780 A | | 6/1994 | Edelman |
| 5,325,324 A | * | 6/1994 | Rentzepis et al. ............ 365/127 |
| 5,331,659 A | | 7/1994 | Ohata et al. |
| 5,585,640 A | | 12/1996 | Huston et al. |
| 5,777,318 A | | 7/1998 | Krishnamoorthy et al. |
| 5,835,984 A | | 11/1998 | Katz |
| 6,005,791 A | | 12/1999 | Gudesen et al. |
| 6,045,888 A | | 4/2000 | Chen et al. |
| 6,172,926 B1 | | 1/2001 | Drayer |
| 6,267,911 B1 | * | 7/2001 | Yen et al. ............... 252/301.4 R |
| 6,432,610 B1 | * | 8/2002 | Rentzepis et al. ....... 430/270.15 |
| 6,437,329 B1 | | 8/2002 | Yedur et al. |

(Continued)

FOREIGN PATENT DOCUMENTS

FR 2798236 3/2001

(Continued)

OTHER PUBLICATIONS

Milster T.D.; Y. Zhang; C.D. Pinto; E.P. Walker "A Voumetric Memory Device Based on Photo-Chromic Compounds" Optical Science Center, University of Arizona, Tucson.

(Continued)

*Primary Examiner*—Anh Phung
*Assistant Examiner*—Michael Lulis
(74) *Attorney, Agent, or Firm*—Dickstein Shapiro LLP

(57) ABSTRACT

An optical memory cell having a material layer associated with a pixel capable of emitting and receiving light. The material layer has phosphorescent material formed therein for storing data as light received from and emitted to the pixel.

19 Claims, 5 Drawing Sheets

U.S. PATENT DOCUMENTS

| | | | |
|---|---|---|---|
| 6,483,735 B1* | 11/2002 | Rentzepis | 365/119 |
| 6,608,774 B1* | 8/2003 | Rentzepis | 365/127 |
| 6,733,946 B2 | 5/2004 | Kumacheva et al. | |
| 2002/0041264 A1 | 4/2002 | Quanrud | |
| 2003/0073031 A1* | 4/2003 | Rentzepis et al. | 430/270.15 |
| 2003/0230629 A1 | 12/2003 | Bourianoff et al. | |
| 2004/0057314 A1 | 3/2004 | Pavlichek | |

FOREIGN PATENT DOCUMENTS

| | | |
|---|---|---|
| GB | 1126419 | 12/1966 |
| JP | 2031399 A | 2/1990 |
| WO | WO 2004/023192 A2 | 3/2004 |

OTHER PUBLICATIONS

Kann J.L.; B.W. Canfiled; A.A. Jamberdino, B.J. Clarke, E. Daniszewski; G Sunada "Optical Mass Storage and Retrieval at Rome Laboratory".

Chi C.J.; A.J. Steckl "Digital Thin-film Color Optical Memory" Applied Physics Letters, vol. 78, No. 2; Jan. 8, 2001.

Tang J.; B. Seshadri; K.N. Naughton; B.K. Lee, R.C. J. Chi; A.J. Steckl "CMOS-Based Photoreceiver Arrays for Page-Oriented Optical Storage Access" IEEE Photonics Tech. Letters, vol. 12, No. 9, Sep. 2000.

Liao N.; M. Gong; D. XU; G. QL; K. Zhang "Single-beam two photon three dimensional optical storage in a pyrryl-substituted fulgide photochromic material" Chinese Sc. Bulletin; vol. 46, No. 22.; Nov. 2001.

Burr G.W., J. Ashley; H. Coufal; R. Grygier, J. Hoffnagle, C.M. Jefferson; B. Marcus "Modulation coding for pixel matched holographic data Storage" Optic Letters vol. 22, No. 9; May 1997.

Chao T.; Zhou H.; Reyes G. "Compact Holographic Data Storage System" NASA article.

Goswani D. "Optical Computing: Optical Components and Storage Systems" Resonance Jun. 2003.

Manykin E.A. "Modern Possibilities of Coherent Photon-Echo-Type Processes for a Quantum Optical Computer" Laser Physics, vol. 12, No. 4, 2002, pp. 158-163.

Quang T.; M. Woldeyohannes; S. John "Coherent Control of Spontaneous Emission near a Photonic Band Edge: A Single-Atom Optical Memory Device" Physical Review Letters; vol. 79, No. 26, Dec. 1997.

Krishnamoorthy. A.V.; T.K. Woodward; K.W. Goossen, J.A. Walker, S.P. Hui, B. Tseng; J.E. Cunningham, W.Y. Jan, F.E. Kiamilev, D.A. Miller " Dual Function Detector-Modulator Smart-Pixel Module" Applied Optics; vol. 36; No. 20; Jul. 10, 1997.

Bisi 0.; S. Ossicini; L. Pavesi "Porous Silicon: A Quantum Sponge Structure for Silicon Based Optoelectronics" Surface Science Reports 38 (2000) 1-126.

Wong H. "Recent Developments in Silicon Optoelectronic Devices" Microelectronics Reliability 42 (2002) 317-326.

Quellette, Jennifer, "Smart Pixels Wed Optics and Electronics," The Industrial Physicist, Jun. 1999, 10-13, American Institute of Physics.

Wang et al., "Highly Efficient Polymer Light-Emitting Devices Using a New Phosphorescent Material," 2003, Chin. Phys. Lett., vol. 20 No. 7, pp. 1141-1143.

* cited by examiner

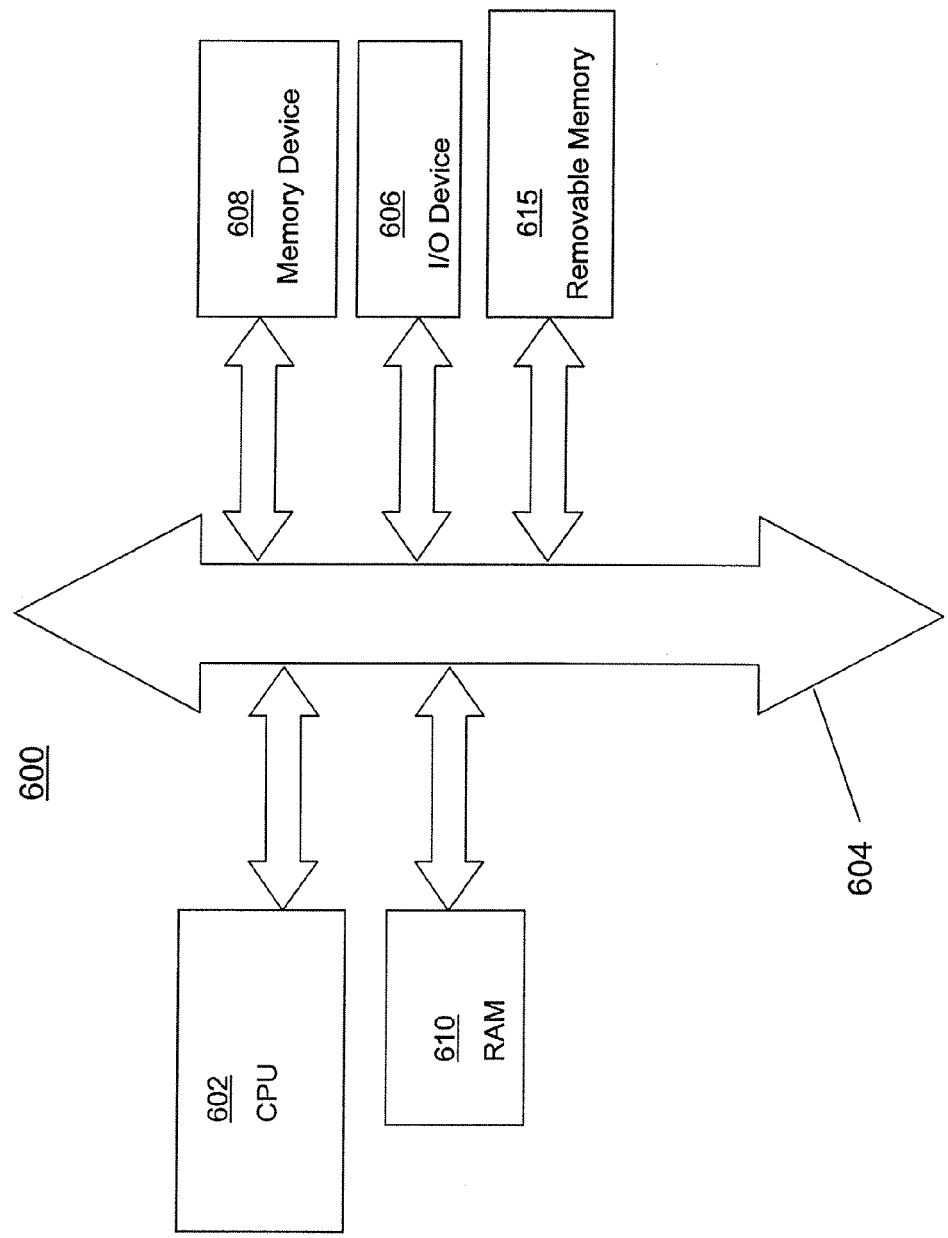

PHOTON-BASED MEMORY DEVICE

This application is a divisional application of application Ser. No. 10/924,225, filed Aug. 24, 2004 now U.S. Pat. No. 7,352,007, which is hereby incorporated herein by reference in its entirety.

FIELD OF THE INVENTION

The present invention relates to a memory cell, specifically a photon-based memory cell.

BACKGROUND OF THE INVENTION

Integrated circuit designers have always sought the ideal semiconductor memory: a device that is randomly accessible; can be written to or read from very quickly; is non-volatile, but indefinitely alterable; and consumes little power.

One common volatile memory is the DRAM in which information can be written to and read from as bits of data, e.g., a "1" or a "0," where a "1" generally corresponds to one voltage state stored on a capacitor, and a "0" generally corresponds to another voltage state stored in the capacitor. The capacitor of the DRAM cell typically has an associated transistor that acts as a switch to allow the control circuitry on the memory chip to read from and write to the capacitor.

DRAM cells suffer from a number of shortcomings. First, the capacitor of a DRAM cell is extremely energy inefficient because capacitors of DRAM cells quickly lose their stored voltage, and need to be refreshed to prevent the cell from being discharged, resulting in high levels of energy consumption. Second, because DRAM cells are based on electrical signals, the speed of integrated chips are not only limited by the speed by which electrons travel through matter, but are also limited by the number of interconnections within the chip necessary to effect proper transfer and storage of the signals; these additional interconnections contribute to the problem of short circuits. Finally, the electrical signals used in conventional memory cells can interfere with each other, resulting in increased cross-talk, and decreased performance, which is undesirable.

Accordingly, there is a desire and need to construct a memory cell that improves upon the shortcomings of DRAM cells.

BRIEF SUMMARY OF THE INVENTION

Various exemplary embodiments of the invention provide a photon-based memory cell having a material layer having phosphorescent materials therein associated with a pixel capable of emitting and receiving light. The data is stored in the memory cell as radiation in the phosphorescent material.

BRIEF DESCRIPTION OF THE DRAWINGS

The above-described features and advantages of the invention will be more clearly understood from the following detailed description, which is provided with reference to the accompanying drawings in which:

FIG. 5 is a block diagram of a processor system incorporating a memory device constructed in accordance with an exemplary embodiment of the invention.

DETAILED DESCRIPTION OF THE INVENTION

In the following detailed description, reference is made to specific exemplary embodiments of the invention. It is to be understood that other embodiments may be employed, and that structural and electrical changes may be made without departing from the spirit or scope of the present invention.

The term "semiconductor substrate" is to be understood to include any semiconductor-based structure that has an exposed semiconductor surface. The semiconductor structure should be understood to include silicon, silicon-on-insulator (SOI), silicon-on-sapphire (SOS), doped and undoped semiconductors, epitaxial layers of silicon supported by a base semiconductor foundation, and other semiconductor structures. The semiconductor substrate need not be silicon-based. The semiconductor could be silicon-germanium, germanium, or gallium arsenide. When reference is made to a semiconductor substrate in the following description, previous process steps may have been utilized to form regions or junctions in or over the base semiconductor or foundation. Also, the invention may be formed over non-semiconductor substrates.

The fabrication steps below are discussed as being performed in an exemplary order, however this order may be altered and still maintain the spirit and scope of the invention.

Figure 1:
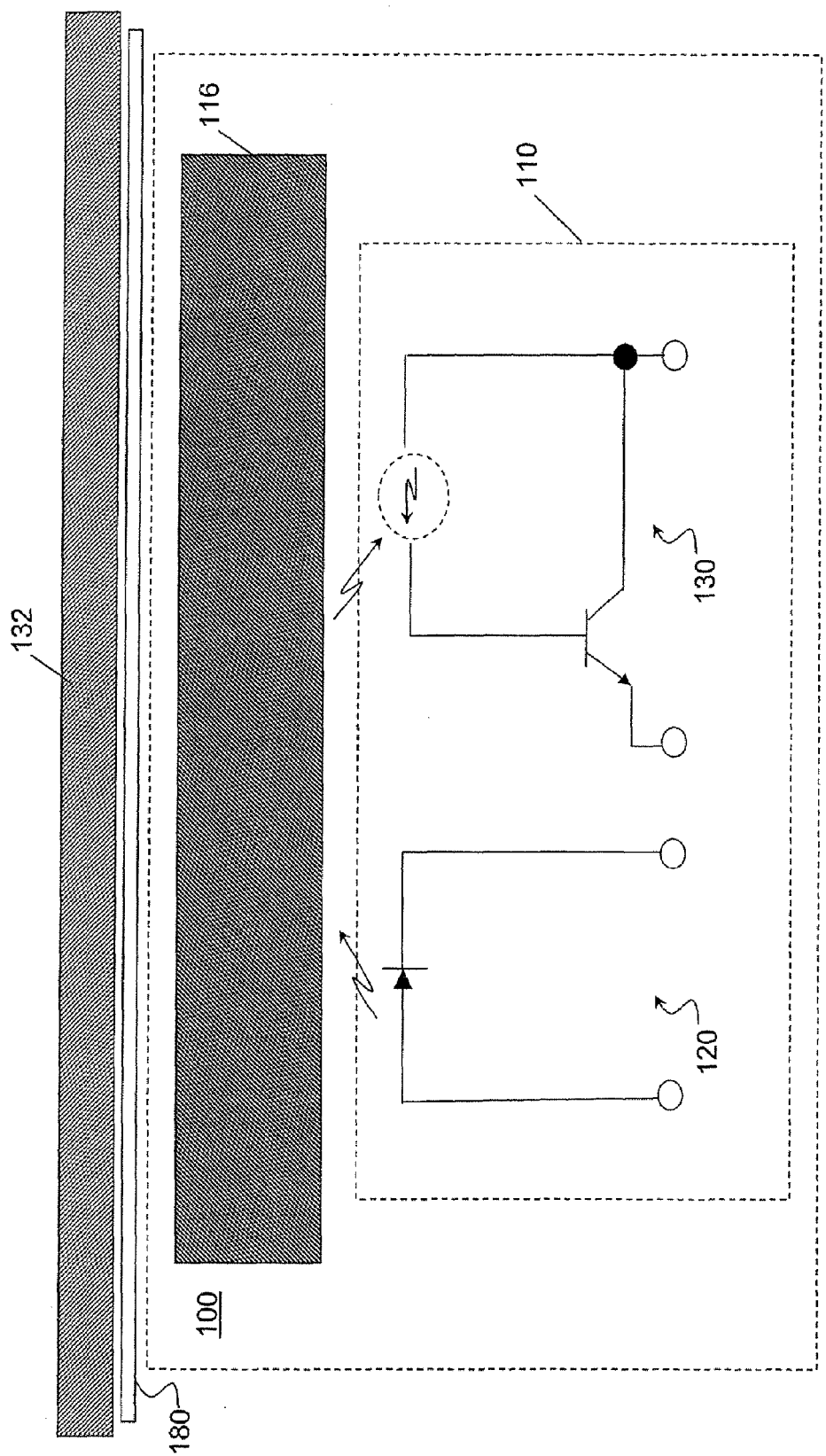
FIG. 1 illustrates a cross-sectional view of a memory cell constructed in accordance with an exemplary embodiment of the invention.

Referring now to the drawings, where like elements are designated by like reference numerals, FIG. 1 illustrates a partial cross-sectional view of a memory cell 100 constructed in accordance with an exemplary embodiment of the invention. The illustrated memory cell 100 includes a material layer 116 having phosphorescent material formed therein associated with a pixel 110 capable of emitting and receiving light. The illustrated pixel 110 has a light emitting element 120 and a light receiving element 130. The memory cell 100 can store and transmit bits of data, represented by 1's and 0's, similar to the conventional memory cells discussed above (e.g., a DRAM cell).

In operation of the memory cell 100, the light emitting element 120 (illustrated as a light emitting diode) is activated to emit radiation in the form of photons (depicted by the arrow) onto the material layer 116. The phosphorescent material in the material layer 116 over the pixel 110 absorbs the radiation emitted by the light emitting element 120 and reradiates the energy, also in the form of photons. The presence or absence of reradation of photons by the material layer 116 above the pixel 110 corresponds to a particular logic state potential, e.g., a 1 or 0, similar to the electrons stored on the capacitor of the DRAM, discussed above.

In reading the memory cell 100, the reradation (depicted by the arrow) by the phosphorescent material within the material layer 116 is read by a light receiving element 130 (illustrated as a phototransistor) when the light receiving element 130 is activated by electrical signals from external circuitry. Once activated, the reradation from the phosphorescent material layer 116 causes the light receiving element 130 to produce a detectable electrical signal, which is different from an electrical signal produced by light receiving element 130 when there is no light shone or reradiated from the overlying material layer 116. Thus, the output signal from the light receiving element 130 represents a logic "1" or "0" depending on whether the material layer 116 above the light receiving element is storing light or not.

Memory cell 100 does not suffer from the same drawbacks as conventional memory cells. Unlike the capacitors of conventional DRAM memory cells, memory cell 100 is much more energy efficient, and does not have to be refreshed every few milliseconds. Phosphorescent materials generally reradiate for up to several minutes, limited only by the half-life of the specific phosphorescent material used in the material layer 116. Therefore, memory cell 100 can be refreshed every minute or so, rather than every few milliseconds, resulting in a significant reduction in energy consumption. Refreshing is accomplished by reading the memory array containing a plurality of memory cells 100 and rewriting to those cells having light stored therein.

Memory cell 100 also has a faster read/write speed than conventional DRAM cells because the information is retained as photons, and not as an electrical potential; therefore, the information stored in the material layer 116 does not have to be transmitted through matter, as electronically stored information would. Additionally, because the information from the memory cell 100 is stored in the form of photons, a decreased number of electrical interconnections are necessary, reducing the number of fabrication short circuits compared with DRAM memory cells.

It should be noted that although the light emitting element 120 is illustrated as a light emitting diode, this is only exemplary. For example, the light emitting element 120 could include any device capable of emitting radiation, including visible light, x-rays, infrared radiation, or UV radiation. Similarly, although illustrated as a phototransistor, the light receiving element 130 could be any device capable of receiving radiation, and converting the radiation into an electrical signal. Moreover, a single integrated light emitting and light receiving structure can also be used for light emitting and light receiving elements 120, 130.

The material layer 116 could have a thickness in the range of about 100 Å to about 2000 Å, depending on the intended application. The material layer is formed by doping a material layer with phosphorescent materials. The phosphorescent materials used could be selected from the group consisting of copper activated polycrystalline zinc sulfides, rare earth doped alkaline earth sulfides, and organic dyes like bis(2-phenyl-benzoimiazole) acetylacetonato iridium. It should be noted that the materials listed are only exemplary, and should not be limiting in any way.

FIG. 1 also illustrates an optional light emitting device 132 in light communication with the memory cell 100. The light emitting device 132 may be used to perform a masked programming of an array of memory cells 100, similar to light programmable EEPROM arrays. The light emitting device 132 can also be used to globally erase a memory array by turning all memory cells on.

The light emitting device 132 could be integral to a memory die containing an array of memory cells for global erase programming. Alternatively, the light emitting device 132 could be located externally to the array containing memory cells. In an embodiment in which the light emitting device 132 is located externally to the array, the memory die in which the array is located would typically have a transparent element 180 allowing the light to enter the die to allow a light masked programming operation. The light emitting device 132 could comprise an epitaxial silicon layer having a plurality of light emitting diodes fabricated therein. The light emitting device 132 could also be constructed as a laser located externally to the memory die in which the array is contained, which can be programmable to light material layer 116 to set a programmed state of a memory array.

Figure 2:
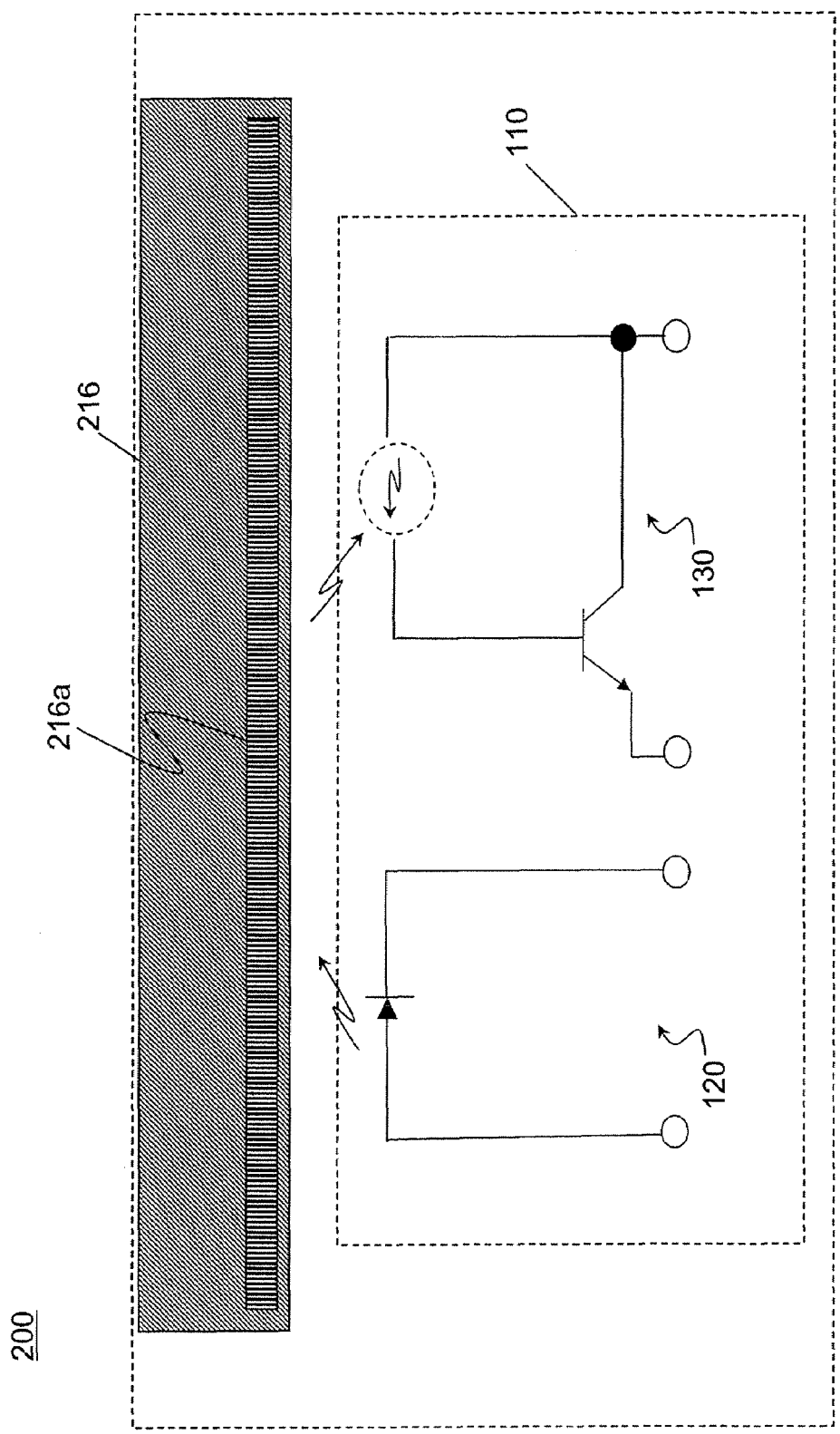
FIG. 2 illustrates a partial cross-sectional view of a memory cell constructed in accordance with a second exemplary embodiment of the invention.

FIG. 2 illustrates a partial cross-sectional view of a memory cell 200 constructed in accordance with a second exemplary embodiment of the invention. Like the FIG. 1 memory cell 100, the FIG. 2 memory cell 200 has a material layer 216 associated with a pixel 110 capable of emitting and receiving light. The material layer 216 could have a thickness in the range from about 1000 Å to about 2000 Å. The material layer 216 of the illustrated memory cell 200 has a thickness of about 1500 Å.

The illustrated material layer 216 includes a plurality of nanotubes 216a that are substantially perpendicular to the pixel 110. The nanotubes 216a could have a length in the range from about 50 Å to about 150 Å, for example. The illustrated nanotubes may have a length of about 100 Å. Each nanotube 216a includes one or more of the phosphorescent materials discussed above with respect to FIG. 1. Because the nanotubes 216a are substantially perpendicular to the pixel 110, the amount of cross-talk between memory cells in an array (e.g., array 314 (FIG. 3)) can be further reduced.

The FIG. 2 memory cell 200 operates in substantially the same manner as the FIG. 1 memory cell 100, except that when the light emitting element 120 emits radiation onto the material layer 216, only those nanotubes 216a containing phosphorescent material localized above the pixel 110 will reradiate. Therefore, the reradiation is more localized, and the nanotubes reduce cross-talk among adjacent memory cells.

It should be noted that although the nanotubes 216a are illustrated as being at a 90° angle relative to the pixels 110, it is not intended to be limiting in any way. For example, the nanotubes 216a could be at any angle relative to the pixel 110. It should also be noted that not all of the nanotubes 216a are necessarily straight, and that the nanotubes 216a may contain bends and turns.

The material layer 216 could be formed by forming the nanotubes 216a in the material layer 216, and then doping the nanotubes 216a with one or more of the phosphorescent materials discussed above with respect to FIG. 1. Alternatively, the material layer 216 could be formed by implanting a thin silicon layer with boron and anodizing the silicon layer in a solution of hydrogen fluoride (HF) and isopropanol.

Figure 3:
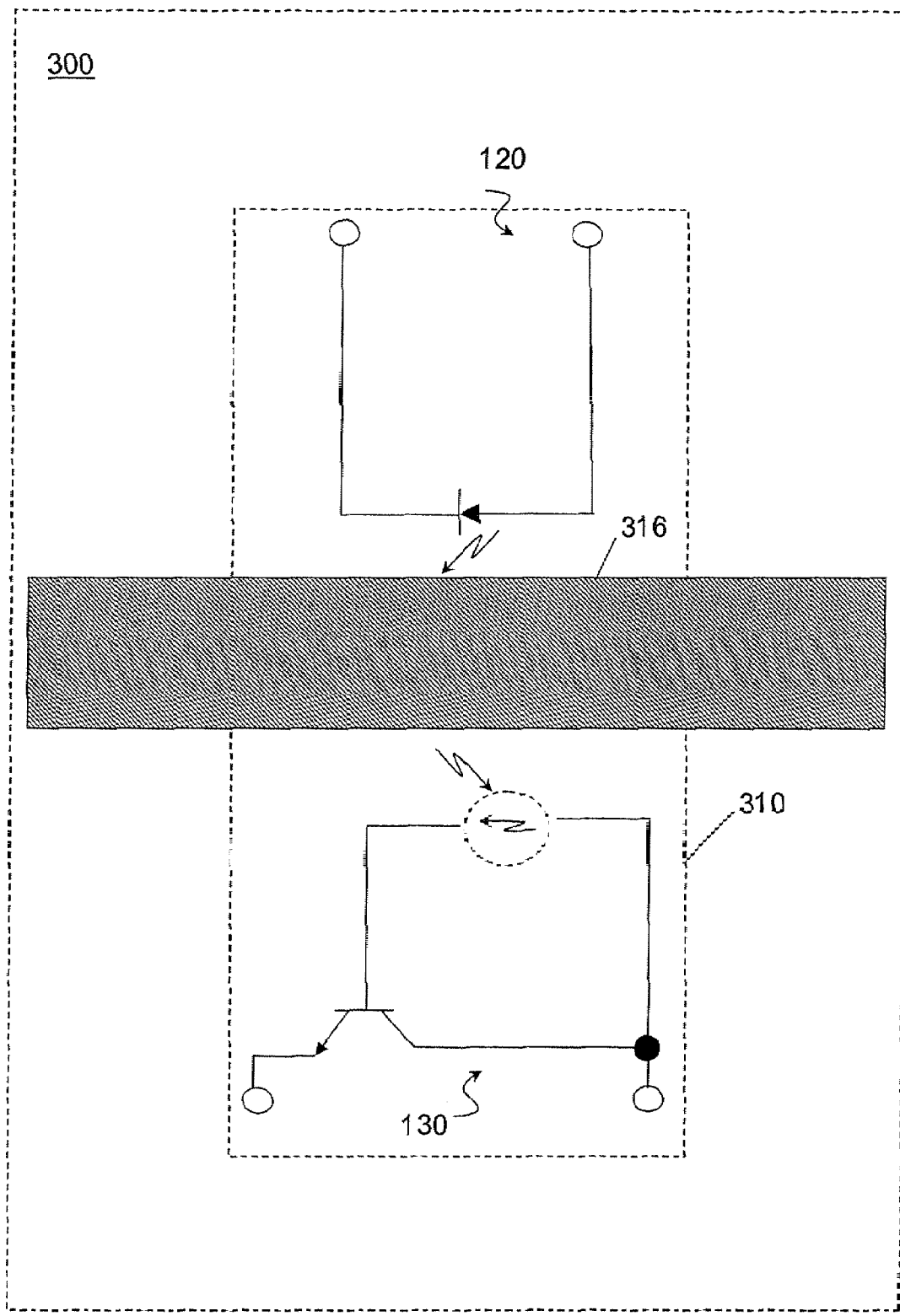
FIG. 3 illustrates a partial cross-sectional view of a memory cell constructed in accordance with a third exemplary embodiment of the invention.

FIG. 3 illustrates a partial cross-sectional view of a memory cell 300 constructed in accordance with a third exemplary embodiment of the invention. Like the FIG. 1 and FIG. 2 memory cells 100, 200, the illustrated memory cell 300 has a material layer 316 having phosphorescent material contained therein associated with a pixel 310 capable of emitting and receiving light. The exemplary embodiment provides the material layer 316 within the pixel 310; between the light emitting element 120 and the light receiving element 130.

An array of memory cells including the illustrated memory cell 300 could be formed by providing an array of light receiving elements 130 in a silicon substrate and providing a material layer 316 over the light receiving element array. The material layer 316 could be doped with any of the phosphorescent materials discussed above with respect to FIG. 1. An epitaxial silicon substrate having an array of light emitting elements 120 could then be deposited over the material layer 316, forming an array of memory cells. It should be noted that the light emitting 120 and light receiving 130 elements should be substantially aligned with one another.

The FIG. 3 memory cell 300 operates in substantially the same manner as the FIG. 1 and FIG. 2 memory cells 100, 200, in that the light emitting element 120 writes data to the material layer 316, and the light emitting element 130 reads data from the material layer 316.

Figure 4:
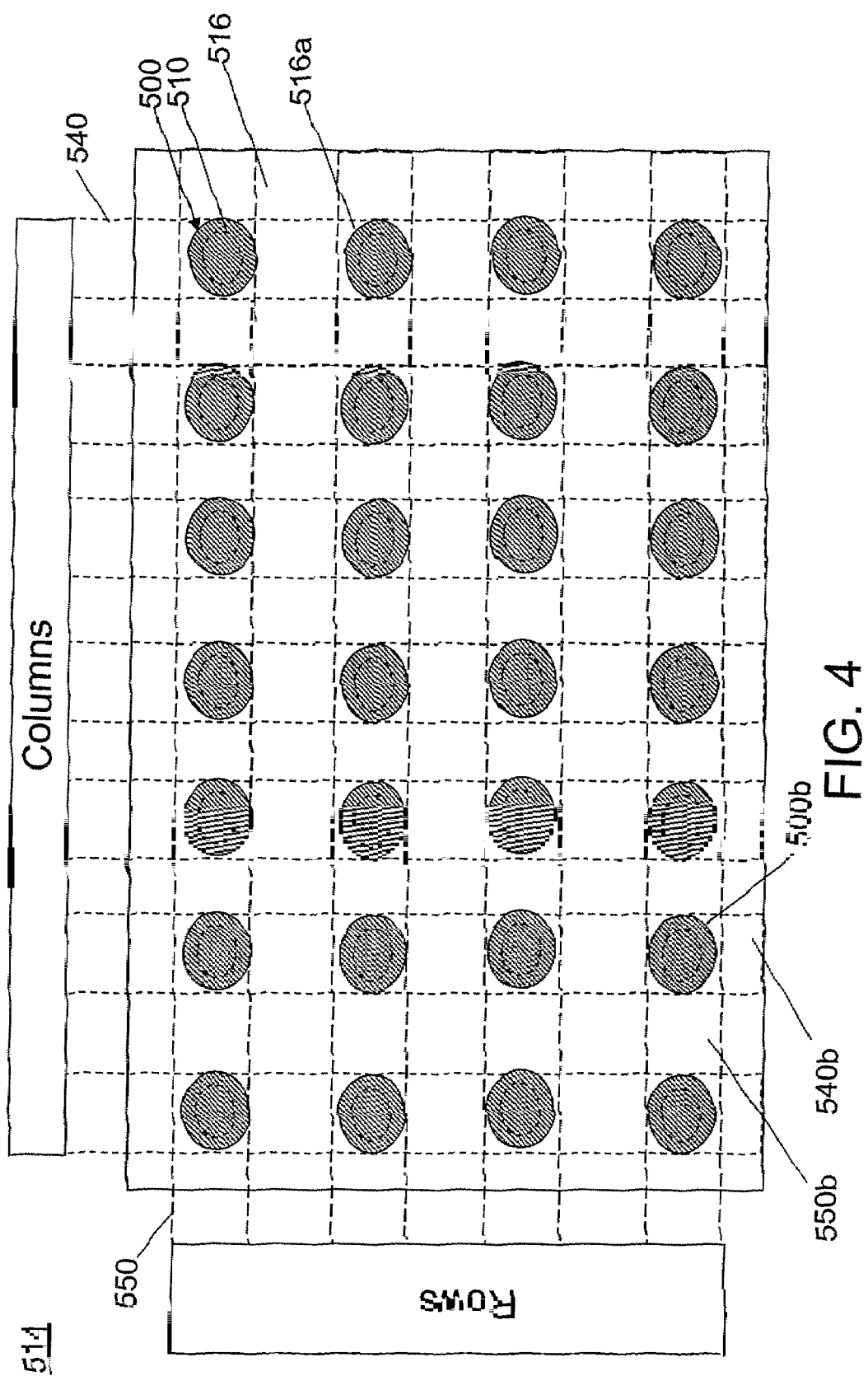
FIG. 4 illustrates a partial top-down view of a memory cell array constructed in accordance with an exemplary embodiment of the invention.

FIG. 4 illustrates a partial top-down view of a memory array 514 constructed in accordance with an exemplary embodiment of the invention. The memory cells 500 of the array 514 are arranged in rows and columns. Each illustrated memory cell 500 has a material layer 516 associated with a pixel 510. Phosphorescent regions 516a of the material layer 516 are provided in a pattern positioned above respective pixels 510 in the array 514. The separated phosphorescent regions 516a minimize cross-talk between adjacent memory cells 500.

The material layer 516 is selectively doped with phosphorescent material to create the phosphorescent regions 516a. The phosphorescent regions 516a are formed by forming a patterned photoresist layer over a material layer 516, such that the doping of the material layer 516 occurs through the pattern aligning phosphorescent regions 516a with the underlying pixels 510. Any phosphorescent material discussed above with respect to FIG. 1 could be used to dope the material layer 516, resulting in the phosphorescent regions 516a.

FIG. 4 also illustrates a bitline 540 connected to column control circuitry and a wordline 550 connected to row control circuitry. Each memory cell 500 is written to or read from by activating the corresponding bitline and wordline, and further selecting either the light emitting element 120, or the light receiving element 130 for actuation. For example, to write to or read from a selected memory cell 500b, a corresponding bitline 540b and a corresponding wordline 550b are turned on, and the selected memory cell 500b can be either written to or read from, in accordance with a write or read signal which selects light emission and light reception as discussed above with respect to FIG. 1.

Although not illustrated, each memory cell 500 of the array 514 would have a write/read conductor, which could be positioned under each memory cell 500 of the array 514. In operation, the write/read conductor in one logic state activates the light emitting elements of the selected memory cells 500 to store bits of data. The write/read conductor in a second logic state activates the light receiving elements of selected memory cells 500 to read bits of data. It should be noted, that the write/read conductors could be connected to a transistors that are associated with the light emitting and light receiving elements of the memory cells 500. The transistors act as a switch that turn the light emitting and light receiving elements on and off.

It should be noted that the separated phosphorescent regions 516a shown in FIG. 4 could be incorporated into any of the memory cells discussed above with respect to FIGS. 1-3, i.e., memory cells 100, 200, 300. The material layer 116, 216, 316 over each pixel of each memory cell 100, 200, 300 could have separated phosphorescent regions formed therein, thereby reducing the amount of cross-talk among adjacent memory cells.

FIG. 5 illustrates a block diagram of a processor system 600 incorporating a memory device having a memory cell (e.g., memory cells 100, 200, 300) or a memory cell array (e.g., 514) constructed in accordance with exemplary embodiments of the invention. Examples of processor based systems include, without limitation, computer systems, camera systems, scanners, machine vision systems, vehicle navigation systems, video telephones, surveillance systems, auto focus systems, star tracker systems, motion detection systems, image stabilization systems, and others.

The exemplary system 600 includes a memory device 608 having one or more of the memory cells constructed in accordance with exemplary embodiments of the invention (e.g., memory cells 100, 200, 300). The memory device 608 could also incorporate the FIG. 4 memory cell array 514.

The system 600 generally comprises a central processing unit (CPU) 602, such as a microprocessor, that communicates with an input/output (I/O) device 606 over a bus 604. The memory device 608 also communicates with the CPU 602 over the bus 604. The system 600 also includes random access memory (RAM) 610, and can include removable memory 615, such as flash memory, which also communicates with CPU 602 over the bus 604. Imaging device 608 may be combined with a processor, such as a CPU, digital signal processor, or microprocessor, with or without memory storage on a single integrated circuit or on a different chip than the processor.

The above description and drawings illustrate preferred embodiments which achieve the objects, features, and advantages of the present invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. A method of fabricating a memory die, comprising the steps of:
    forming a semiconductor substrate supporting a memory cell array, the memory cell array formed by:
        forming a plurality of pixels on the semiconductor substrate, each pixel capable of emitting and receiving light; and
        forming a material over the plurality of pixels, the material having nanotubes formed therein, the nanotubes having phosphorescent material localized over each pixel, the phosphorescent material capable of receiving light from and emitting light to the pixel; and
    electrically coupling the memory cell array to the semiconductor substrate.

2. The method of claim 1, wherein the phosphorescent material is formed by doping the nanotubes with copper activated polycrystalline zinc sulfides.

3. The method of claim 2, further comprising the step of depositing a photoresist layer over the nanotubes prior to doping.

4. The method of claim 2, wherein the nanotubes are doped with phosphorescent material after being formed within the material.

5. The method of claim 1, wherein the material is formed by:
    implanting a thin silicon layer with boron; and
    anodizing the silicon layer in a solution of hydrogen fluoride (HF) and isopropanol.

6. The method of claim 1, further comprising forming a light emitting layer over the material.

7. The method of claim 1, wherein the plurality of pixels are formed by providing an array of light receiving elements and providing an array of light emitting elements.

8. The method of claim 7, wherein the light receiving elements are formed in the semiconductor substrate.

9. The method of claim 7, wherein the light emitting elements are formed within an epitaxial layer of silicon over the semiconductor substrate.

10. The method of claim 7, wherein the light receiving elements and the light emitting elements are formed to be substantially aligned with each other.

11. The method of claim 7, wherein the material is provided between the array of light receiving elements and the array of light emitting elements.

12. A method of forming a processor system, comprising the steps of:
providing a processor;
forming an array of memory cells on a semiconductor substrate supporting a memory cell array, the memory cell array formed by:
forming a plurality of light emitting elements and respective light detecting elements within the semiconductor substrate; and
forming a material localized over each light emitting element, the material capable of receiving light from and emitting light to the light emitting element and a respective light detecting element, the material having a phosphorescent material formed therein; and
coupling readout circuitry within the semiconductor substrate to the processor.

13. The method of claim 12, wherein the phosphorescent material is formed by doping the material with copper activated polycrystalline zinc sulfides.

14. The method of claim 13, further comprising the step of depositing a photoresist layer over the material layer prior to doping.

15. The method of claim 13, wherein nanotubes are formed prior to doping.

16. The method of claim 15, wherein the nanotubes are formed as having a thickness in the range of from about 1000 Å to about 2000 Å.

17. The method of claim 15, wherein the nanotubes have a length in the range of from about 50 Å to about 150 Å.

18. A method of forming a memory die, comprising:
forming a substrate supporting a memory cell array, the memory cell array formed by:
forming a pixel array, each pixel having a light emitting element and a respective light detecting element on the substrate, the pixels in the array arranged in rows and columns;
forming a phosphorescent material localized over each pixel in the array by patterning a photoresist material over a material layer, and doping portions of the material layer with dopants having phosphorescent properties; and
removing the patterned photoresist material from the phosphorescent material; and
electrically coupling the memory cell array to the substrate.

19. The method of claim 18, wherein the phosphorescent material is formed within a plurality of nanotubes formed therein.

* * * * *